United States Patent
Pal et al.

(10) Patent No.: US 7,320,937 B1
(45) Date of Patent: Jan. 22, 2008

(54) METHOD OF RELIABLY ELECTROLESS-PLATING INTEGRATED CIRCUIT DIE

(75) Inventors: Rathindra N. Pal, Beltsville, MD (US); Kingsley R. Berlin, Odenton, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 330 days.

(21) Appl. No.: 11/253,879

(22) Filed: Oct. 19, 2005

(51) Int. Cl.
*H01L 21/44* (2006.01)

(52) U.S. Cl. ............... 438/678; 438/677; 257/E21.174; 257/E21.224

(58) Field of Classification Search ........... 438/678, 438/677, 614; 257/E21.479, E21.224, E21.174
See application file for complete search history.

(56) References Cited

U.S. PATENT DOCUMENTS

| | | | |
|---|---|---|---|
| 6,028,011 A | 2/2000 | Takase et al. | |
| 6,637,638 B1* | 10/2003 | Farnworth et al. | 228/36 |
| 6,759,751 B2 | 7/2004 | Sinha | |
| 6,821,909 B2* | 11/2004 | Ramanathan et al. | 438/758 |
| 2005/0001316 A1* | 1/2005 | Dean et al. | 257/750 |
| 2005/0001324 A1* | 1/2005 | Dunn et al. | 257/762 |
| 2005/0101130 A1* | 5/2005 | Lopatin et al. | 438/678 |

OTHER PUBLICATIONS

Jittinorasett, Suwanna; UBM Formation on Single Die/Dice for Flip Chip Applications; Thesis submitted to the Faculty of the Virginia Polytechnic Institute and State University for M.S.E.E; Aug. 29, 1999, Blacksburg, VA USA; Copyright 1999, Suwanna Jittinorasett.

* cited by examiner

*Primary Examiner*—Caridad Everhart
(74) *Attorney, Agent, or Firm*—Robert D. Morelli

(57) ABSTRACT

The present invention is a reliable method of electroless-plating integrated circuit die that achieves high yield. Die are attached to a holder using a polyimide adhesive to eliminate voltage differences on bond pads which would otherwise interfere with the plating. The die are aggressively cleaned using multiple cleaning solutions, one heated to a user-defined temperature. Each cleaning is followed by an aggressive rinse in de-ionized water. Die are immersed into multiple metal solutions at user-definable temperatures. Each immersion is followed by an aggressive rinse in de-ionized water, one with heated de-ionized water.

13 Claims, 1 Drawing Sheet

METHOD OF RELIABLY ELECTROLESS-PLATING INTEGRATED CIRCUIT DIE

FIELD OF THE INVENTION

The present invention pertains to semiconductor device manufacturing process and, more particularly, flip-chip-type assembly.

BACKGROUND OF THE INVENTION

Integrated circuits have become affordable and widely used because of at least two economies of scale in the semiconductor device manufacturing process. The first is the density at which electrical components can be fabricated into an integrated circuit. The second is the number of integrated circuits that may be fabricated at one time on a semiconductor wafer. Integrated circuits fabricated on a semiconductor wafer are then separated, by dicing, and packaged.

The typical packaging technique is to package one integrated circuit at a time using wires individually bonded to each conductive input and output pad of an integrated circuit. Since an integrated circuit may require a large number of bond wires, serial wire-bonding slows data propagation and is susceptible to high defect rates. A packaging technique that offers higher throughput and lower defect rates is wireless bonding.

Wireless bonding includes flip-chip and tape automated bonding (TAB). Flip-chip bonding involves depositing solder bumps onto the conductive pads of the integrated circuit, which are on the top of the integrated circuit die, flipping the die over, aligning the solder bumps to an interconnect layer (i.e., the wireless bonding media), and connecting the die to the interconnect layer by causing the solder bumps to flow. TAB, or TAB bonding, is accomplished by gang-bonding conductive fingers formed in tape to the conductive pads of an integrated circuit.

The prior art listed below describes the basic steps of a flip-chip technique as follows. Clean the bond pads. Activate the bond pads by immersing them in a Zinc (Zn) solution. Deposit a metal (e.g., Nickel (Ng)) onto the bond pads to a desired height. Deposit a compressible metal (e.g., Gold (Au)) that adheres well to solder. Deposit solder bumps onto the compressible metal.

A problem with the prior art methods is not so much in the materials that are used but how the materials are used. Present methods that use identical materials but in different ways exhibit widely low and inconsistent reliability.

Another problem that exists at the die level and not the wafer level is the ability to reliably form solder bumps on bond pads. A voltage difference exists between bond pads formed over different semiconductor materials (i.e., p-type and n-type). The materials under the bond pads act as minute batteries of different voltages. These voltage differences interfere with the plating of the bond pads. The present invention solves this problem in a manner the results in high and consistent reliability.

U.S. Pat. No. 6,028,011, entitled "METHOD OF FORMING ELECTRIC PAD OF SEMICONDUCTOR DEVICE AND METHOD OF FORMING SOLDER BUMP," discloses a method of forming solder bumps on bond pads by carefully controlling the acidity, or pH, levels of solutions of metals used to form solder bumps. U.S. Pat. No. 6,028,011 does not disclose a method of solving the die-level problem described above, as does the present invention. U.S. Pat. No. 6,028,011 is hereby incorporated by reference into the specification of the present invention.

U.S. Pat. No. 6,637,638, entitled "SYSTEM FOR FABRICATING SOLDER BUMPS ON SEMICONDUCTOR COMPONENTS," discloses a method of using Palladium as a compressible metal that adheres well to solder. U.S. Pat. No. 6,637,638 does not disclose a method of solving the die-level problem described above, as does the present invention. U.S. Pat. No. 6,637,638 is hereby incorporated by reference into the specification of the present invention.

U.S. Pat. No. 6,759,751, entitled "CONSTRUCTIONS COMPRISING SOLDER BUMPS," discloses a method of using Palladium underneath the inexpensive metal (e.g., Ni) deposited to a desired height. U.S. Pat. No. 6,759,751 does not disclose a method of solving the die-level problem described above, as does the present invention. U.S. Pat. No. 6,637,638 is hereby incorporated by reference into the specification of the present invention.

A master thesis by Suwanna Jittinorasett, for the Virginia Polytechnic Institute and State University, entitled "UBM Formation on Single Die/Dice for Flip Chip Applications," published on Aug. 25, 1999, describes a method of plating bond pads at the die level. However, the cleaning process described in the thesis would not result in high and consistent reliability, as would the method of the present invention.

SUMMARY OF THE INVENTION

It is an object of the present invention to uniformly and reliably plate bond pads on individual integrated circuit die for accepting flip-chip solder bumps.

It is another object of the present invention to uniformly and reliably plate bond pads on individual integrated circuit die for accepting flip-chip solder bumps by eliminating the voltage difference problem between bond pads.

It is another object of the present invention to uniformly and reliably plate bond pads on individual integrated circuit die for accepting flip-chip solder bumps by optimally cleaning the bond pads prior to plating.

The present invention is a method of uniformly and reliably plating bond pads on individual integrated circuit die for accepting solder bumps.

The first step of the method is receiving at least one integrated circuit die.

The second step of the method is attaching the die to a holder with a dielectric adhesive.

The third step of the method is cleaning the die with more than one cleaning solution.

The fourth step of the method is rinsing each die in de-ionized water after each cleaning in the last step.

The fifth step of the method is immersing the die into a first metal oxide etchant for a user-definable time.

The sixth step of the method is cleaning the die in de-ionized water.

The seventh step of the method is immersing the die into a first metal solution for a user-definable time, where the first metal solution is at a user-definable temperature.

The eighth step of the method is cleaning the die in de-ionized water.

The ninth step of the method is immersing the die into a second metal etchant solution for user-definable time.

The tenth step of the method is cleaning the die in de-ionized water.

The eleventh step of the method is immersing the die into the first metal solution for a user-definable time, where the first metal solution is at a user-definable temperature.

The twelfth step of the method is cleaning the die in de-ionized water.

The thirteenth step of the method is plating a user-definable thickness of a second metal onto the die.

The fourteenth step of the method is cleaning the die in de-ionized water.

The fifteenth step of the method is immersing the at least one integrated circuit die in a third metal solution for a user-definable time, where the third metal solution is at a user-definable temperature, and where the third metal solution is stirred at a user-definable rate.

DETAILED DESCRIPTION

Figure 1:
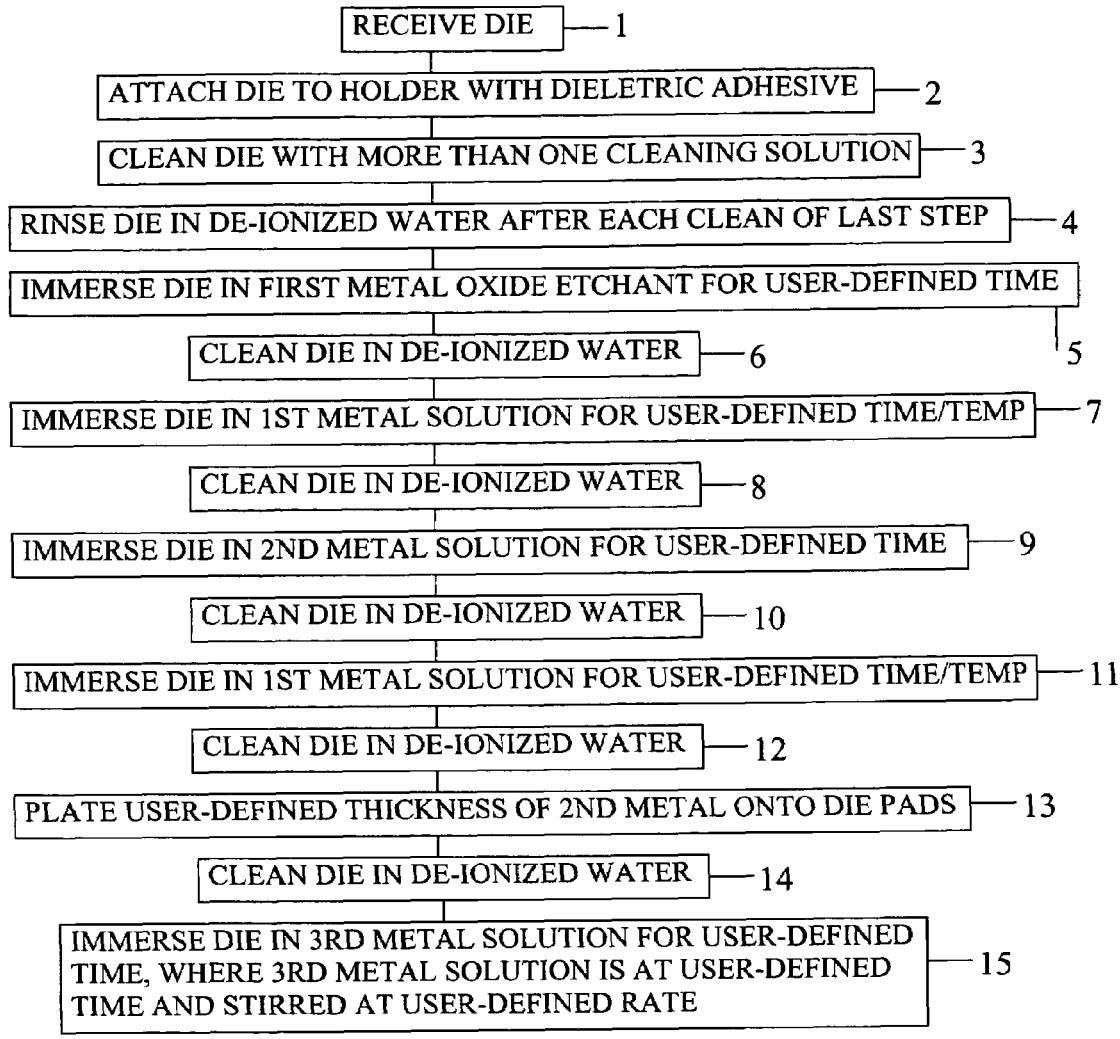
FIG. 1 is a list of the steps of the present invention.

The present invention is a reliable method of plating bond pads on individual integrated circuit die for accepting solder bumps. The Highly Accelerated Stress Test (HAST) at 135 degrees Centigrade with 95% Relative Humidity, for 1000 hours, was performed on die processed with the present method and yields from 96% to 98% were achieved. The reasons for such success include elimination of any voltage difference between pads on the die, aggressive cleaning steps with multiple cleaning solutions, tight tolerances on solution temperatures, and the use of a heated de-ionized water rinsing step, and so on. The steps of the method are listed in FIG. 1.

The first step 1 of the method is receiving at least one integrated circuit die. Each integrated circuit die has a pad side and a backside. Typically, the pads are made of aluminum. The present method is designed for aluminum pads, but it may be adapted for pads of any metal with metal specific chemicals.

The second step 2 of the method is attaching the die backside to a holder. The holder includes a dielectric adhesive layer (e.g., polyimide). Commercially available Kapton tape may be applied to a holder, sticky-side out to receive die. The polyimide dissipates any difference in voltage on the pads caused by the difference in material (n-type or p-type) under the pads. If such voltage differences were not eliminated then the voltages would interfere with the plating of the pads and could result in some pads not being plated. Both sides of the holder may accept die. The holder should be of a size that would allow solution to freely flow around it. Multiple die may be placed on both the front and back of the holder.

The third step 3 of the method is cleaning the die with more than one cleaning solution. The cleaning solutions include acetone, methanol, isopropyl alcohol, and a solution containing 20% ethoxylated dodecyl mercapton, 1.5% diethylene triamine, and 78.5% de-ionized water. The die are soaked into each solution for 10 minutes, 5 minutes, 5 minutes, and 10 minute, respectively. During cleaning, each solution should be agitated by the holder (e.g., stirring the solution with the holder as one would stir coffee). For the last cleaning solution in the list, a magnetic stirrer may be used. The last cleaning solution in the list is also heated (i.e., 65 degrees Centigrade+/−2 degrees Centigrade). The temperature may be achieved by filling a crystallizing dish ⅔ full of de-ionized water, heating the water on a hot plate, filling a beaker with the cleaning solution, and placing the beaker in the dish. A lid may be used to help achieve and maintain the temperature of the cleaning solution. It was also found that using a glass thermometer was better than using a metal one. Metal thermometers interfere with chemistries that include metal. This heating procedure, with adjustment for desired temperature, may be used for all of the heated solutions in the present method. The heated cleaning solution is also stirred using a magnetic stirrer, where the stirrer is rotated at high revolutions per minute (RPM).

The fourth step 4 of the method is rinsing each die in de-ionized water after each cleaning step in the third step 3. The de-ionized water in the fourth step is at room temperature and is not heated. Rinsing is achieved by placing the holder in a beaker of de-ionized water so that the die is immersed, agitate the water with the holder as mentioned above for a user-definable amount of time (e.g., a minute or two), removing the holder from the water, rinsing the die under a flow of de-ionized water (e.g., rinsing the die 3 times), and spraying the holder with de-ionized water. Other rinsing steps in the present method that use room temperature de-ionized water is done in accordance with this procedure. In addition, after each use of de-ionized water in the present method, the used de-ionized water is discarded, the container is cleaned, and the container is replenished with clean de-ionized water.

The fifth step 5 of the method is immersing the die into a first metal oxide etchant for a user-definable time. In the preferred embodiment, the die are immersed vertically into the etchant. It was found that verticality had an impact on the effectiveness of a solution on the die. All immersions in the present method are vertical immersions. Since pads on die are typically aluminum, the etchant is an aluminum oxide etchant such as 30% hydrofluoric acid and 70% de-ionized water or an other commercially available aluminum oxide etchant. The die are immersed into the etchant for one minute, and are agitated within the etchant during the entire time, while maintaining verticality.

The sixth step 6 of the method is cleaning the die in de-ionized water as described above.

The seventh step 7 of the method is immersing the die into a first metal solution for a user-definable time, where the first metal solution is at a user-definable temperature. In the preferred embodiment, the die is immersed vertically into a Zinc solution at a temperature of 35 degrees Centigrade+/−2 degrees Centigrade for 40 seconds. The Zinc solution is >3% sodium hydroxide, >0.5% zinc oxide, and <96.5% de-ionized water. The Zinc solution should be agitated the entire time by the holder, while maintaining verticality of the holder. The heated Zinc solution may be achieved by filling a crystallizing dish ⅔ full of de-ionized water, heating it on a hot plate, filling a beaker with the Zinc solution, and placing the beaker in the crystallizing dish. Again, lids and glass thermometers should be used to attain and maintain the temperature.

The eighth step 8 of the method is cleaning the die in de-ionized water as described above.

The ninth step 9 of the method is immersing the die into a second metal etchant solution for user-definable time. In the preferred embodiment, the die is immersed vertically into a nitric acid solution (e.g., 25% nitric acid, 75% de-ionized water) for no more than the time it takes to dip the die once into the solution. If the die is allowed to linger too long in nitric acid too much aluminum is etched from the pads and the results will be degraded.

The tenth step 10 of the method is cleaning the die in de-ionized water as described above.

The eleventh step 11 of the method is immersing the die into the first metal solution (i.e., the Zinc solution) for a user-definable time, where the first metal solution is at a user-definable temperature. In the preferred embodiment, the die is immersed vertically into the Zinc solution for 30 seconds, where the temperature of the solution is 35 degrees Centigrade+/−2 degrees Centigrade. The holder should agitate the solution during the entire time, while maintaining verticality.

The twelfth step 12 of the method is cleaning the die in de-ionized water as described above.

The thirteenth step 13 of the method is plating a user-definable thickness of a second metal onto the pads of the die. In the preferred embodiment, 13 um of Nickel are plated onto the pads. The Nickel solution is <2.1% nickel sulfate, <3% sodium hypophosphate, 1.5% sodium hydroxide, 1.5% acetic acid, and 91.9% de-ionized water. The solution is heated to 88 degrees Centigrade+/−2 degrees Centigrade. If the solution is at full strength then it is estimated that it would take 30 minutes to plate 13 um of Nickel onto the pads. If the solution is of lesser strength then it will take more time to plate 13 um of Nickel. During plating, the Nickel solution should be agitated, using a magnetic stirrer rotating at 350 RPM.

The fourteenth step 14 of the method is cleaning the die in heated de-ionized water. In the preferred embodiment, the de-ionized water is heated to 60 degrees Centigrade+/−2 degrees Centigrade. Otherwise, the cleaning is as described above.

The fifteenth step 15 of the method is immersing the die in a third metal solution for a user-definable time, where the third metal solution is at a user-definable temperature, and where the third metal solution is stirred at a user-definable rate. In the preferred embodiment, the die is immersed vertically into a Gold solution for 15 minutes, where the solution is heated to 72 degrees Centigrade+/−2 degrees Centigrade. The Gold solution is >98.066% de-ionized water, <0.934% ethylene diamine, <0.934 potassium fluoride, and >0.066 sodium gold sulfide. The solution is stirred using a magnetic stirrer rotating at 350 RPM.

Dry the die gently with nitrogen gas.

The die may then be removed from holder. This may be achieved by bending the Kapton tape on either side of the die until one line of tape touches the center of the die. Then, remove the die with tweezers. Flick the die from the tape to avoid flaking of sides of the die.

What is claimed is:

1. Method of electroless-plating at least one integrated circuit die, comprising the steps of:
    (a) receiving the at least one integrated circuit die, where each at least one integrated circuit die has a pad side and a backside;
    (b) attaching the at least one integrated circuit die backside to a holder, where the holder has a dielectric adhesive layer applied thereto;
    (c) cleaning the at least one integrated circuit die with more than one cleaning solution;
    (d) rinsing each at least one integrated circuit die in de-ionized water after each cleaning in the more than one cleaning solution;
    (e) immersing the at least one integrated circuit die into a first metal oxide etchant for a user-definable time;
    (f) cleaning the at least one integrated circuit die in de-ionized water;
    (g) immersing the at least one integrated circuit die into a first metal solution for a user-definable time, where the first metal solution is at a user-definable temperature;
    (h) cleaning the at least one integrated circuit die in de-ionized water;
    (i) immersing the at least one integrated circuit die into a second metal etchant solution for user-definable time;
    (j) cleaning the at least one integrated circuit die in de-ionized water;
    (k) immersing the at least one integrated circuit die into the first metal solution for a user-definable time, where the first metal solution is at a user-definable temperature;
    (l) cleaning the at least one integrated circuit die in de-ionized water;
    (m) plating a user-definable thickness of a second metal onto the padside of the at least one integrated circuit die;
    (n) cleaning the at least one integrated circuit die in de-ionized water; and
    (o) immersing the at least one integrated circuit die in a third metal solution for a user-definable time, where the third metal solution is at a user-definable temperature, and where the third metal solution is stirred at a user-definable rate.

2. The method of claim 1, wherein said step of attaching the at least one integrated circuit die backside to a holder is comprised of the step of attaching the at least one integrated circuit die backside to a holder, where the holder has a polyimide adhesive layer applied thereto.

3. The method of claim 1, wherein said step of cleaning the at least one integrated circuit die with more than one cleaning solution is comprised of the step of cleaning the at least die with each of the cleaning solutions selected from the group consisting of acetone, methanol, isopropyl alcohol, a solution of 20% ethoxylated dodecyl mercapton, 1.5% diethylene triamine, and 78.5% de-ionized water at 65 C.+/2 C. for 10 minutes, 5 minutes, 5 minutes, and 10 minutes, respectively.

4. The method of claim 1, wherein said step of rinsing each at least one integrated circuit die in de-ionized water after each cleaning in the more than one cleaning solution is comprised of the steps of:
    (a) immersing the at least one integrated circuit die in unused de-ionized water;
    (b) agitating the de-ionized water with the holder;
    (c) removing the holder from the de-ionized water; and
    (d) rinsing the at least one integrated circuit die under de-ionized water three times.

5. The method of claim 1, wherein the step of immersing the at least one integrated circuit die into a first metal oxide etchant is comprised of the step of immersing the at least one integrated circuit die vertically into an aluminum oxide etchant for at least one minute, agitating the aluminum oxide etchant with the holder.

6. The method of claim 1, wherein each step of cleaning the at least one integrated circuit die in de-ionized water is comprised of the steps of:
    (a) immersing the at least one integrated circuit die in unused de-ionized water heated to 60 C.+/−2 C.;
    (b) removing the holder;
    (c) rinsing the at least one integrated circuit die in de-ionized water three times; and
    (d) spraying the holder with de-ionized water.

7. The method of claim 1, wherein said step of immersing the at least one integrated circuit die into a first metal solution is comprised of the step of immersing the at least one integrated circuit die vertically in a Zinc solution that includes >3% sodium hydroxide, >0.5% zinc oxide, <96.5% de-ionized water for around 40 seconds, where the Zinc solution is at a temperature of 35 C.+/−2 C., and agitating the holder during the 40 seconds.

8. The method of claim 1, wherein said step of immersing the at least one integrated circuit die into a second metal etchant solution is comprised of the step of immersing the at least one integrated circuit die vertically into nitric acid once for no more that it would take to dip the holder into the nitric acid and remove the holder.

9. The method of claim 1, wherein said step of immersing the at least one integrated circuit die into the first metal solution for a user-definable time is comprised of the step of immersing the at least one integrated circuit die vertically in a Zinc solution that includes >3% sodium hydroxide, >0.5% zinc oxide, <96.5% de-ionized water for around 30 seconds, where the Zinc solution is at a temperature of 35 C.+/−2 C., and agitating the holder during the 30 seconds.

10. The method of claim 1, wherein said step of plating a user-definable thickness of a second metal onto the pad side of the at least one integrated circuit die is comprised of the step of plating 13 um of Nickel onto the pad side of the at least one integrated circuit die by immersing the at least one integrated circuit die into a Nickel solution of <2.1% nickel sulfate, <3% sodium hypophosphate, 1.5% sodium hydroxide, 1.5% acetic acid, and 91.9% de-ionized water for 30 minutes, where the Nickel solution is at a temperature of 88 C.+/−2 C., and is agitated by a magnetic stirrer rotating at 350 RPM.

11. The method of claim 1, wherein said step of immersing the at least one integrated circuit die in a third metal solution is comprised of the step of immersing the at least one integrated circuit die in a Gold solution that includes >98.066% de-ionized water, <0.934% ethylene diamine, <0.934 potassium fluoride, >0.066 sodium gold sulfide, for 15 minutes, where the Gold solution is at a temperature of 72 C., +/−2 C., and is agitated by a magnetic stirrer rotating at 350 RPM.

12. The method of claim 1, further including the step of drying the at least one integrated circuit die in nitrogen gas.

13. The method of claim 1, further including the step of removing the at least one integrated circuit die from the holder.

* * * * *